(12) United States Patent
Chang et al.

(10) Patent No.: US 12,092,833 B2
(45) Date of Patent: Sep. 17, 2024

(54) HEAD-MOUNTED DISPLAY DEVICE

(71) Applicant: HTC Corporation, Taoyuan (TW)

(72) Inventors: Li-Hsun Chang, Taoyuan (TW); Kuan-Ying Ou, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 18/087,810

(22) Filed: Dec. 23, 2022

(65) Prior Publication Data

US 2024/0210706 A1 Jun. 27, 2024

(51) Int. Cl.
*G02B 27/01* (2006.01)
*H05K 7/20* (2006.01)
*F16K 31/02* (2006.01)

(52) U.S. Cl.
CPC ..... *G02B 27/0176* (2013.01); *H05K 7/20145* (2013.01); *H05K 7/20172* (2013.01); *F16K 31/025* (2013.01)

(58) Field of Classification Search
CPC ..... G02B 27/0176; G06F 1/163; G06F 1/203; G06F 3/011; G06F 2200/201; H05K 7/20145; H05K 7/20154; H05K 7/20172
See application file for complete search history.

(56) References Cited

U.S. PATENT DOCUMENTS

| | | | |
|---|---|---|---|
| 6,446,876 B1 | 9/2002 | Stefano et al. | |
| 10,642,327 B1* | 5/2020 | Silvanto | H05K 7/20209 |
| 10,827,054 B2 | 11/2020 | Cha et al. | |
| 11,726,337 B1* | 8/2023 | Huang | G02B 27/0149 |
| | | | 345/80 |
| 2019/0250651 A1* | 8/2019 | Liu | G05D 16/2066 |
| 2020/0110449 A1* | 4/2020 | Chang | H05K 7/20172 |
| 2020/0324011 A1 | 10/2020 | Jin et al. | |
| 2022/0072545 A1 | 3/2022 | Keller et al. | |
| 2023/0125348 A1* | 4/2023 | Kulkarni | F04D 27/002 |
| | | | 415/220 |

OTHER PUBLICATIONS

"Notice of allowance of Taiwan Counterpart Application", issued on Jul. 18, 2023, p. 1-p. 4.

* cited by examiner

*Primary Examiner* — Nelson M Rosario
(74) *Attorney, Agent, or Firm* — JCIPRNET

(57) ABSTRACT

A head-mounted display device includes a body, a fan, a first valve, and a first shape memory alloy element. The body is configured to be worn on a face of a user. The body has an air channel, an air outlet, and a first air inlet. The first air inlet is communicated with the air outlet through the air channel. The fan is disposed in the air channel and is configured to drive air inside the air channel to flow. The first valve is disposed in the air channel. The first shape memory alloy element is connected between the first valve and the body, and is configured to move the first valve to adjust airflow inside the air channel.

9 Claims, 6 Drawing Sheets

HEAD-MOUNTED DISPLAY DEVICE

BACKGROUND

Technical Field

The disclosure relates to a head-mounted display device, and in particular to a head-mounted display device for adjusting airflow.

Description of Related Art

With the increasing development of the technology industry, there are quite a lot of types of head-mounted display devices. Taking head-mounted display devices such as a glasses-type head-mounted display device as an example, after such type of display device is worn by a user, in addition to seeing three-dimensional images, the images also change as the user turns the head, which provides the user with a more immersive experience.

However, after the user wears the head-mounted display device for a while, the heat and humidity of the face of the user and the waste heat generated by the head-mounted display device during operation cause the temperature and humidity of air in a space between the face of the user and the head-mounted display device to gradually increase, thereby causing the user to feel uncomfortable. Therefore, currently, some head-mounted display devices use air circulation to cool down and dehumidify this space. Meanwhile, high heat is generated during the operation of the head-mounted display devices, which also needs to be cooled down by the air circulation. Regardless of the purpose of the air circulation, if a valve is adopted to adjust airflow, this solution becomes infeasible due to the heavy weight and noise issue of a driving motor.

SUMMARY

The disclosure provides a head-mounted display device to provide an ideal function of electrically adjusting airflow.

The head-mounted display device of the disclosure includes a body, a fan, a first valve, and a first shape memory alloy (SMA) element. The body is configured to be worn on a face of a user. The body has an air channel, an air outlet, and a first air inlet. The first air inlet is communicated with the air outlet through the air channel. The fan is disposed in the air channel and is configured to drive air inside the air channel to flow. The first valve is disposed in the air channel. The first SMA element is connected between the first valve and the body, and is configured to move the first valve to adjust the airflow inside the air channel.

Based on the above, in the head-mounted display device of the disclosure, the first valve is moved by the first SMA element to adjust the airflow inside the air channel, which provides an ideal function of electrically adjusting the airflow.

DESCRIPTION OF THE EMBODIMENTS

Figure 1:
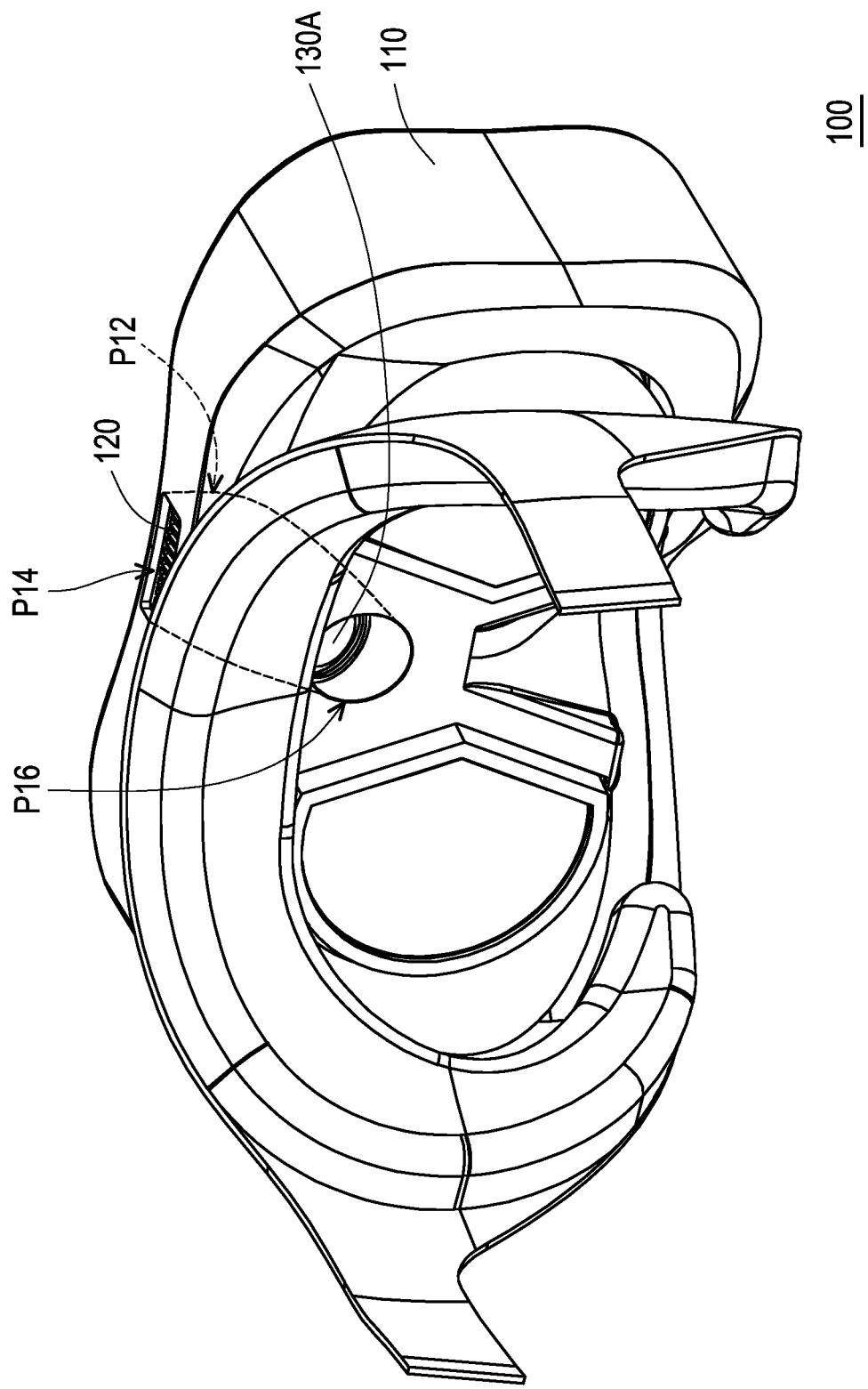
FIG. 1 is a schematic diagram illustrating a head-mounted display device according to an embodiment of the invention.
Figure 3:
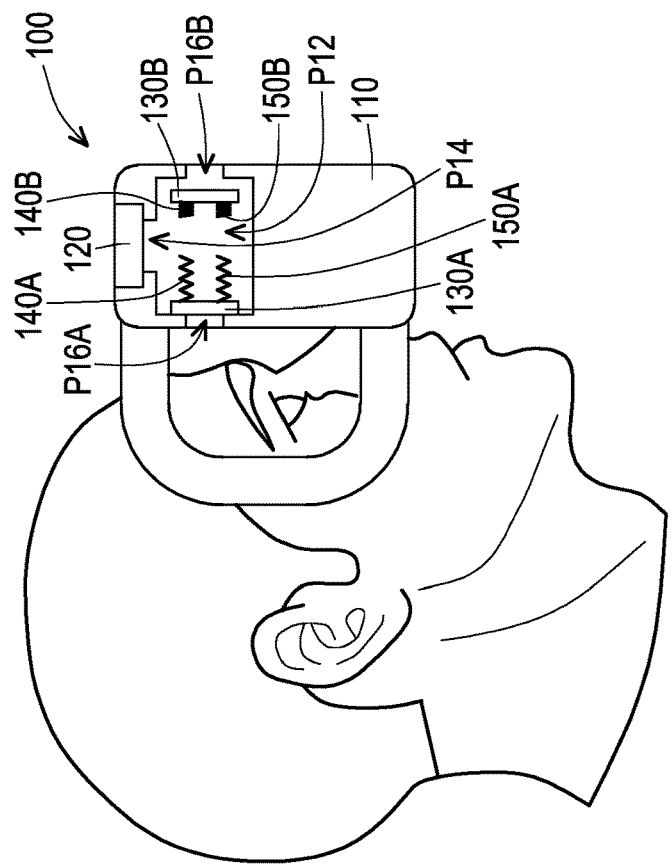
FIGS. 2 and 3 are schematic diagrams illustrating an adjustment mechanism of airflow of the head-mounted display device of FIG. 1.
Figure 2:
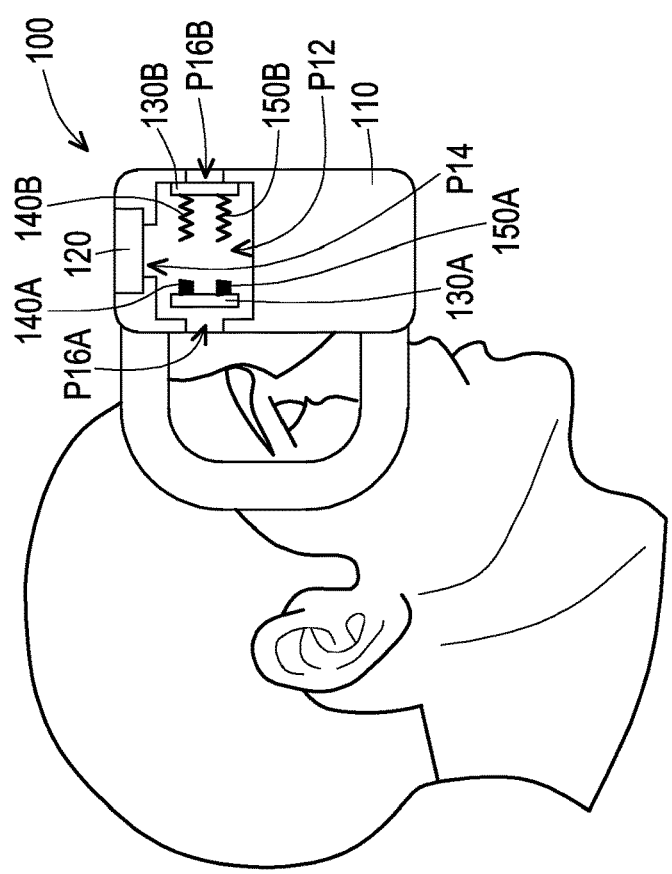

FIG. 1 is a schematic diagram illustrating a head-mounted display device according to an embodiment of the invention. FIGS. 2 and 3 are schematic diagrams illustrating an adjustment mechanism of airflow of the head-mounted display device of FIG. 1. Referring to FIGS. 1 and 2, a head-mounted display device 100 of this embodiment includes a body 110, a fan 120, a first valve 130A, and a first SMA element 140A. The body 110 is configured to be worn on a face of a user. The body 110 has an air channel P12, an air outlet P14, and a first air inlet P16A. The first air inlet P16A is communicated with the air outlet P14 through the air channel P12. The fan 120 is disposed in the air channel P12 and is configured to drive air inside the air channel P12 to flow. The first valve 130A is disposed in the air channel P12. The first SMA element 140A is connected between the first valve 130A and the body 110, and is configured to move the first valve 130A to adjust the airflow of the air channel P12.

As mentioned above, the fan 120 disposed in the air channel P12 is used to drive the air inside the air channel P12 to flow, thereby driving air outside the body 110 to enter the air channel P12 through the first air inlet P16A, and then leave the body 110 through the air outlet P14. As the air flows in the air channel P12, for example, the air flowing may allow air outside to flow into a space between the face of the user and the body 110, which helps to reduce the temperature and humidity of the air in this space, thereby improving wearing comfort for the user. In addition, the air outside flowing into the air channel P12 also helps to reduce the temperature of the body 110, so as to ensure the stability of an operation of the device, and also prevent the user from discomfort due to an increase in the temperature of the body 110. In an embodiment not shown, a sensor may be used to sense the temperature and humidity of the air in the space between the face of the user and the body 110, and the first SMA element 140A is used to move the first valve 130A according to a sensing result, so as to achieve the effect of intelligent control.

In this embodiment, the movement of the first valve 130A may adjust the airflow inside the air channel P12, which changes, for example, the size of a cross-sectional area of the first valve 130A that allows air to pass through in the air channel P12. In addition, the movement of the first valve 130A is achieved using the first SMA element 140A. Since the first SMA element 140A moves the first valve 130A in an electrically controlled manner, a more precise adjustment result may be obtained. Compared with moving the first valve 130A by adopting a driving motor, the adjustment mechanism of this embodiment has much smaller volume and is light in weight and quiet.

In this embodiment, a heating element (not shown) of the body 110 of the head-mounted display device 100 may be directly located in the air channel P12, or a part of a heat radiator may be located in the air channel P12 after being in contact with the heating element. Therefore, the fan 120 drives the air flowing in the air channel P12 to perform good heat dissipation on the heating element. The heating element is, for example, a central processing unit (CPU) or other chips.

In this embodiment, the first valve 130A is disposed in the first air inlet P16A. In addition, the head-mounted display device 100 may further include a second valve 130B and a second SMA element 140B. The body 110 further has a second air inlet P16B. The second air inlet P16B is communicated with the air outlet P14 through the air channel P12. The second valve 130B is disposed in the air channel P12. The second SMA element 140B is connected between the second valve 130B and the body 110, and is configured to move the second valve 130B to adjust the airflow inside the air channel P12. The second valve 130B and the second SMA element 140B may operate in the same manner as the first valve 130A and the first SMA element 140A. Techniques related to the first valve and the first SMA element described in the following embodiments may also be applied to the second valve 130B and the second SMA element 140B.

Referring to FIGS. 2 and 3, in this embodiment, the air channel P12 is communicated with the space between the body 110 and the face of the user through the first air inlet P16A. In addition, the air channel P12 is communicated with the outside through the second air inlet P16B. When the space between the body 110 and the face of the user is relatively hot and humid, the first valve 130A may be moved, so that air may pass through the first air inlet P16A, as shown in FIG. 2, the air between the body 110 and the face of the user is discharged through the air channel P12 and the air outlet P14, and dry and cool air from the outside is sucked into the space between the body 110 and the face of the user. Alternatively, when a virtual scene provided by the head-mounted display device 100 to the user shows gentle breeze or strong wind, the first valve 130A may be moved, so that the air from the first air inlet P16A is blown onto the face of the user, and the airflow blown towards the face of the user is adjusted, so as to correspond to the virtual scene to enhance the sense of immersion.

On the other hand, when the temperature and humidity of the space between the body 110 and the face of the user are pleasant, the first valve 130A may be moved, so that the air does not pass through the first air inlet P16A, and the second valve 130B may be moved, so that the air passes through the second air inlet P16B, as shown in FIG. 3, and cold air from the outside is introduced into the air channel P12 to enhance the heat dissipation of the heating element. Meanwhile, the eyes of the user are prevented from discomfort due to excessively dry air, and noise interference of the fan 120 is reduced.

In this embodiment, the head-mounted display device 100 further includes a reset element 150A connected between the first valve 130A and the body 110, and configured to reset the first valve 130A when the first SMA element 140A is in a power-off state. Additionally, the head-mounted display device 100 further includes a reset element 150B connected between the second valve 130B and the body 110, and configured to reset the second valve 130B when the second SMA element 140B is in a power-off state. The reset elements 150A and 150B may be compression springs, extension springs, coil springs, or other forms of reset elements.

Figure 5:
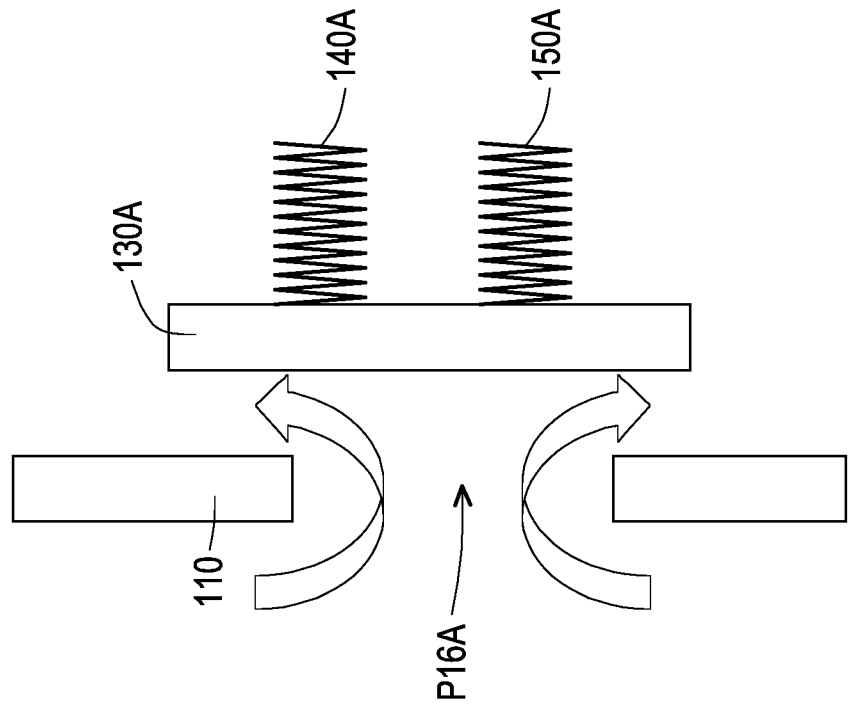
FIGS. 4 and 5 are schematic diagrams illustrating an operation of a valve and a SMA element of the head-mounted display device of FIG. 1.
Figure 4:
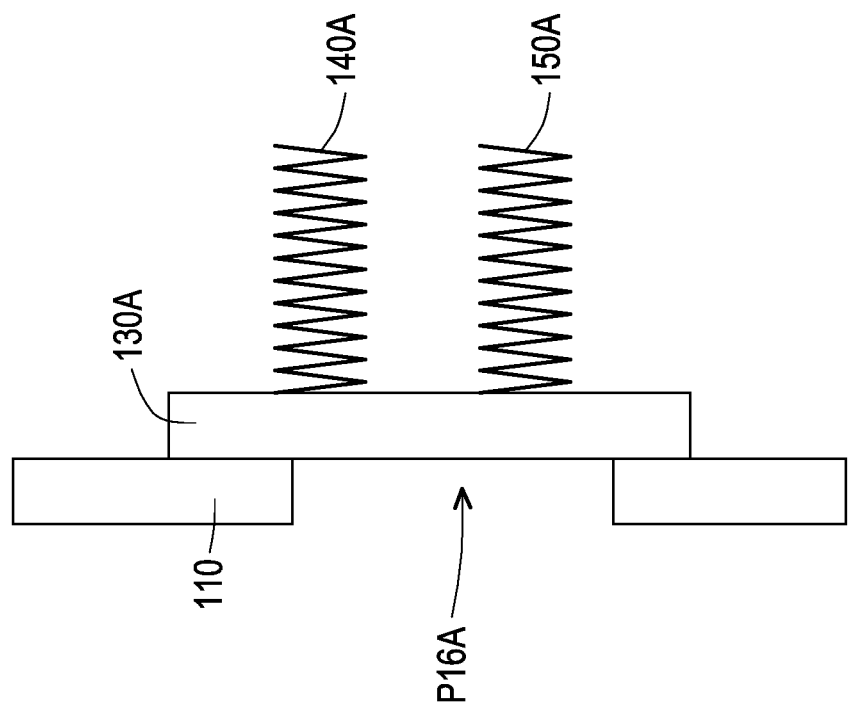

FIGS. 4 and 5 are schematic diagrams illustrating an operation of a valve and a SMA element of the head-mounted display device of FIG. 1. Referring to FIGS. 4 and 5, in an original state, the first SMA element 140A is not powered on, and the first valve 130A is attached to the body 110 to seal the first air inlet P16A. When the first SMA element 140A is powered on and heated to be shortened, the first valve 130A is driven to move to be separated from the body 110, and the first air inlet P16A is opened. Moreover, the airflow passing through the first air inlet P16A may be adjusted according to a distance of the movement of the first valve 130A. When the first SMA element 140A is powered off, the reset element 150A may reset the first valve 130A, that is, the first valve 130A is attached to the body 110 again to seal the first air inlet P16A. On the other hand, an elastic material may also be adopted for the first valve 130A. When the first SMA element 140A is powered off, the first valve 130A is reset by its own elastic restoring force.

Figure 6:
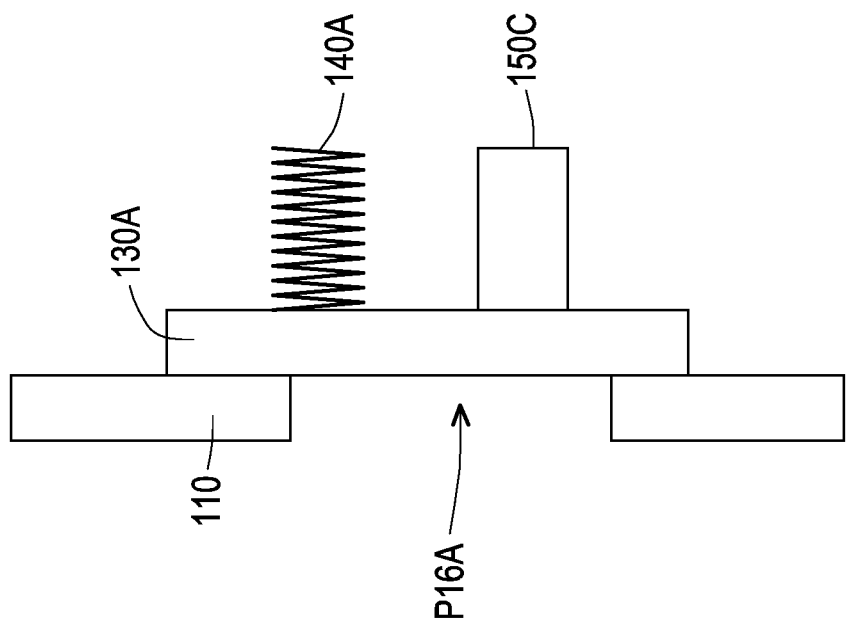
FIG. 6 is a schematic diagram illustrating an operation of a valve and a SMA element of a head-mounted display device according to another embodiment of the invention.

FIG. 6 is a schematic diagram illustrating an operation of a valve and a SMA element of a head-mounted display device according to another embodiment of the invention. Referring to FIG. 6, the head-mounted display device of this embodiment is similar to the head-mounted display device 100 of FIG. 1, and only the differences between the two are described here. In this embodiment, the head-mounted display device further includes a push-push mechanism 150C connected between the first valve 130A and the body 110, and configured to maintain a position of the first valve 130A when the first SMA element 140A is in a power-off state. In an original state, the first SMA element 140A is not powered on, and the first valve 130A is attached to the body 110 to seal the first air inlet P16A.

When the first SMA element 140A is powered on and heated to be shortened, the first valve 130A is driven to move to be separated from the body 110, and the first air inlet P16A is opened. Meanwhile, the first valve 130A also presses the push-push mechanism 150C, so that the push-push mechanism 150C is in a locked state. At this time, even if the first SMA element 140A is powered off and intended to return to the original state, the first valve 130A is pulled by the push-push mechanism 150C to keep the first air inlet P16A in an open state. In other words, the first air inlet P16A may also be in the open state without keeping the first SMA element 140A powered on, so as to save power consumption.

When the first SMA element 140A is powered on again and heated to be shortened, the first valve 130A is driven to press the push-push mechanism 150C again, so that the push-push mechanism 150C is in an unlocked state. At this time, if the first SMA element 140A is powered off, the first SMA element 140A is elongated after being cooled down and pushes the first valve 130A to seal the first air inlet P16A. In this way, power consumption can be saved and the service life of the first SMA element 140A can be extended.

Figure 8:
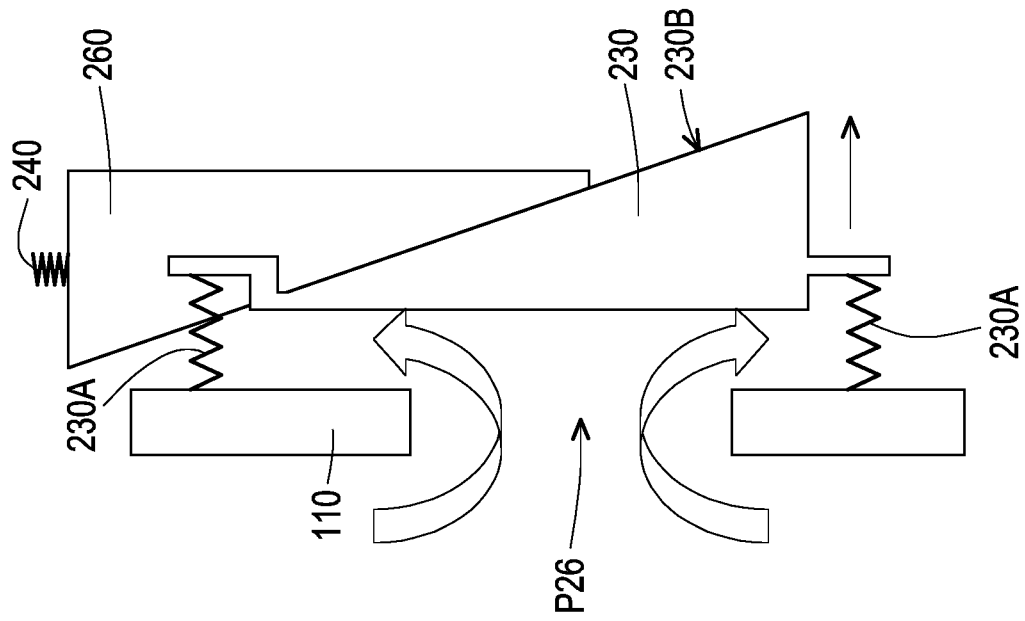
FIGS. 7 and 8 are schematic diagrams illustrating an operation of a valve and a SMA element of a head-mounted display device according to yet another embodiment of the invention.
Figure 7:
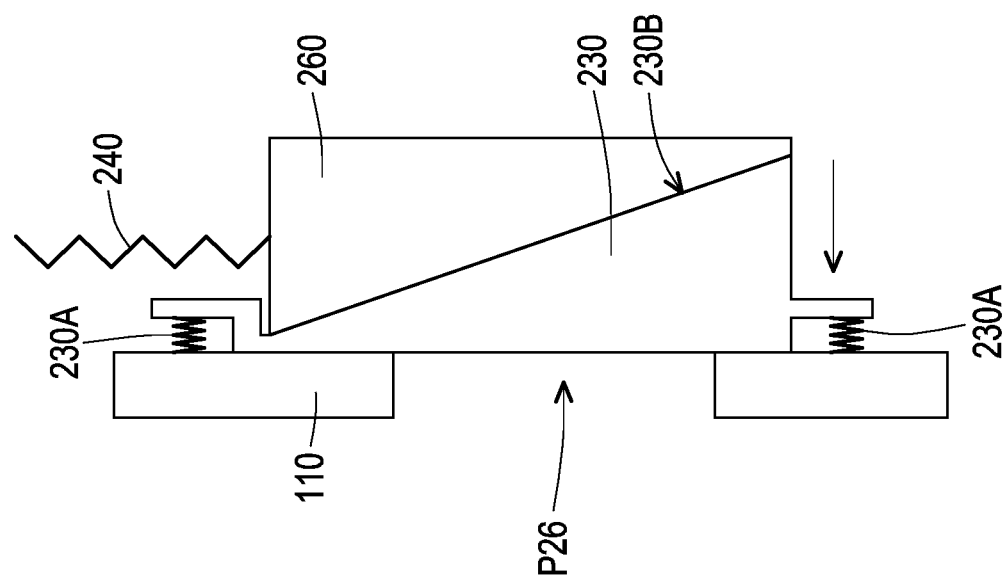

FIGS. 7 and 8 are schematic diagrams illustrating an operation of a valve and a SMA element of a head-mounted display device according to yet another embodiment of the invention. Referring to FIGS. 7 and 8, the head-mounted display device of this embodiment is similar to the head-mounted display device 100 of FIG. 1, and only the differences between the two are described here. In this embodiment, the head-mounted display device further includes a wedge block 260. A first valve 230 has an inclined surface 230B. A first SMA element 240 is connected between the wedge block 260 and the body 110, and is configured to move the wedge block 260 and push the first valve 130A by the wedge block 260 contacting the inclined surface 230B.

In an original state, the first SMA element 240 is not powered on, and the wedge block 260 and the first valve 230 maintain a large degree of overlap, so the first valve 230 is attached to the body 110 to seal a first air inlet P26, as shown in FIG. 7. When the first SMA element 240 is powered on and heated to be shortened, the wedge block 260 is driven to move, and the degree of overlap with the first valve 230 is reduced, so the first valve 230 may be separated from the body 110, and the first air inlet P26 may be opened, as shown in FIG. 8. In this embodiment, a spring 230A is disposed between the first valve 230 and the body 110. When the wedge block 260 moves, and the degree of overlap with the first valve 230 is reduced, the spring 230A pushes the first valve 230 away from the body 110. Moreover, airflow passing through the first air inlet P26 may be adjusted according to a distance of the movement of the first valve 230.

When the first SMA element 240 is powered off, the wedge block 260 is driven to move, and the degree of overlap with the first valve 230 is increased again, thereby pushing the first valve 230 towards the body 110 to seal the first air inlet P26.

Figure 10:
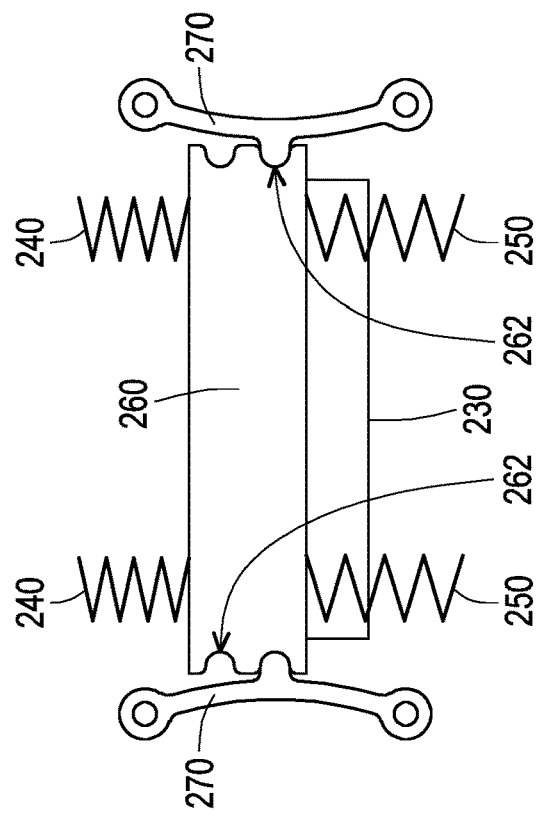
FIGS. 9 and 10 are schematic diagrams illustrating the operation of the valve and the SMA element of FIGS. 7 and 8 from another perspective.
Figure 9:
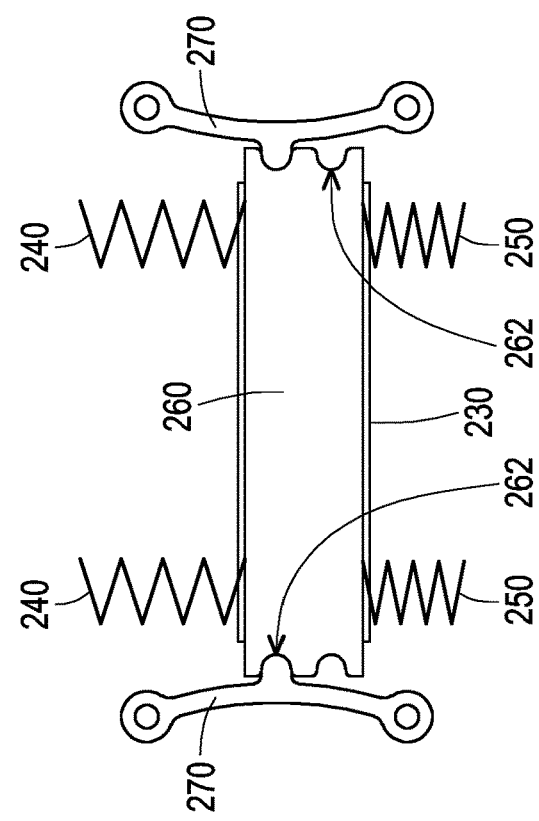

FIGS. 9 and 10 are schematic diagrams illustrating the operation of the valve and the SMA element of FIGS. 7 and 8 from another perspective. Referring to FIGS. 9 and 10, in this embodiment, the head-mounted display device further includes an elastic locking element 270 disposed next to the wedge block 260. The wedge block 260 has multiple locating notches 262. The elastic locking element 270 is configured to be locked in one of the locating notches 262 when the first SMA element 240 is in a power-off state.

In an original state, the first SMA element 240 is not powered on, the wedge block 260 and the first valve 230 maintain a large degree of overlap, and the elastic locking element 270 is locked in one of the locating notches 262 to ensure that a position of the wedge block 260 is fixed. When the first SMA element 240A is powered on and heated to be shortened, the wedge block 260 is driven to move, and the elastic locking element 270 is separated from the original locating notch 262. Until the elastic locking element 270 is aligned with another locating notch 262, the elastic locking element 270 is locked in this locating notch 262 by its own elastic restoring force to ensure that the position of the wedge block 260 is fixed. At this time, even if the first SMA element 240 is powered off and intended to be elongated again, the wedge block 260 is locked by the elastic locking element 270 and cannot be moved to keep the first air inlet P26 (illustrated in FIG. 8) in an open state. In other words, the first air inlet P26A may also be kept in the open state without keeping the first SMA element 240A powered on.

In addition, a second SMA element 250 may also be disposed and connected between the wedge block 260 and the body 110 as in the above-mentioned embodiments, so as to help to move the wedge block 260. The first SMA element 240 and the second SMA element 250 are respectively connected to opposite sides of the wedge block 260. The second SMA element 250 shrinks after being powered on and heated, so as to pull down the wedge block 260, that is, change from the state shown in FIG. 10 to the state shown in FIG. 9.

To sum up, in the head-mounted display device of the disclosure, the airflow inside the air channel may be adjusted by moving the valve using the SMA element, which provides the convenience and precision of electrical control, and the volume and weight of the whole adjustment mechanism can be reduced. In addition, when the air channel includes multiple flow channels, the SMA element may be electrically controlled to move the valve to adjust the flow channels that meet the requirements. When cooperating with a suitable locking mechanism such as the push-push mechanism and the elastic locking element, the air inlet can also be in an open state without keeping the SMA element powered on, which can save power consumption and extend the service life of the SMA element.

What is claimed is:

1. A head-mounted display device, comprising:
a body, configured to be worn on a face of a user, wherein the body has an air channel, an air outlet, and a first air inlet, and the first air inlet is communicated with the air outlet through the air channel;
a fan, disposed in the air channel and configured to drive air inside the air channel to flow;
a first valve, disposed in the air channel;
a first shape memory alloy element, connected between the first valve and the body, and configured to move the first valve to adjust airflow inside the air channel; and
a second valve and a second shape memory alloy element, wherein the body further comprises a second air inlet, the second air inlet is communicated with the air outlet through the air channel, the second valve is disposed in the air channel, and the second shape memory alloy element is connected between the second valve and the body, and is configured to move the second valve to adjust the airflow inside the air channel.

2. The head-mounted display device according to claim 1, wherein the first valve is disposed in the first air inlet.

3. The head-mounted display device according to claim 1, wherein the air channel is communicated with outside through the second air inlet.

4. The head-mounted display device according to claim 1, wherein the air channel is communicated with a space between the body and the face of the user through the first air inlet.

5. The head-mounted display device according to claim 1, further comprising a reset element, connected between the first valve and the body, and configured to reset the first valve when the first shape memory alloy element is in a power-off state.

6. The head-mounted display device according to claim 1, further comprising a push-push mechanism, connected between the first valve and the body, and configured to maintain a position of the first valve when the first shape memory alloy element is in a power-off state.

7. The head-mounted display device according to claim 1, further comprising a wedge block, wherein the first valve has an inclined surface, and the first shape memory alloy element is connected between the wedge block and the body, and is configured to move the wedge block and push the first valve the wedge block contacting the inclined surface.

8. The head-mounted display device according to claim 7, further comprising an elastic locking element, disposed next to the wedge block, wherein the wedge block has a plurality of locating notches, and the elastic locking element is configured to be locked in one of the locating notches when the first shape memory alloy element is in a power-off state to maintain a position of the wedge block.

9. The head-mounted display device according to claim 7, further comprising a second shape memory alloy element, connected between the wedge block and the body, wherein the first shape memory alloy element and the second shape memory alloy element are respectively connected to opposite sides of the wedge block.

* * * * *